(12) United States Patent
Zhang

(10) Patent No.: US 11,894,386 B2
(45) Date of Patent: Feb. 6, 2024

(54) ARRAY SUBSTRATE, MANUFACTURING METHOD THEREOF, AND DISPLAY PANEL

(71) Applicant: SHENZHEN CHINA STAR OPTOELECTRONICS SEMICONDUCTOR DISPLAY TECHNOLOGY CO., LTD., Guangdong (CN)

(72) Inventor: Peng Zhang, Guangdong (CN)

(73) Assignee: SHENZHEN CHINA STAR OPTOELECTRONICS SEMICONDUCTOR DISPLAY TECHNOLOGY CO., LTD., Guangdong (CN)

(*) Notice: Subject to any disclaimer, the term of this patent is extended or adjusted under 35 U.S.C. 154(b) by 870 days.

(21) Appl. No.: 16/963,369

(22) PCT Filed: Jul. 9, 2020

(86) PCT No.: PCT/CN2020/101098
§ 371 (c)(1),
(2) Date: Jul. 20, 2020

(87) PCT Pub. No.: WO2021/248609
PCT Pub. Date: Dec. 16, 2021

(65) Prior Publication Data
US 2023/0253410 A1    Aug. 10, 2023

(30) Foreign Application Priority Data
Jun. 12, 2020   (CN) .......................... 202010534614.3

(51) Int. Cl.
H01L 27/12      (2006.01)
H01L 21/48      (2006.01)
(Continued)

(52) U.S. Cl.
CPC .......... *H01L 27/1225* (2013.01); *H01L 27/12* (2013.01); *H01L 27/127* (2013.01);
(Continued)

(58) Field of Classification Search
CPC ... H01L 27/1225; H01L 27/12; H01L 27/127; H01L 27/1288; H01L 29/78633; H01L 29/7869; H01L 29/41733
See application file for complete search history.

(56) References Cited

U.S. PATENT DOCUMENTS

2007/0052025 A1   3/2007   Yabuta
2008/0135845 A1   6/2008   Heo et al.
(Continued)

FOREIGN PATENT DOCUMENTS

CN   103208526 A   7/2013
CN   103247531 A   8/2013
(Continued)

*Primary Examiner* — Hoa B Trinh
(74) *Attorney, Agent, or Firm* — PV IP PC; Wei Te Chung; Zhigang Ma

(57) ABSTRACT

An array substrate, a manufacturing method thereof, and a display panel are provided. The array substrate includes an active layer, a metal contact layer, a gate insulating layer, a gate layer, a source/drain layer, and a pixel electrode, which are sequentially disposed on a substrate. An insulating area of the metal contact layer corresponds to a channel area of the active layer, and a conductive area of the metal contact layer is disposed at two sides of the insulating area. A source and a drain of the source/drain layer are individually connected to the conductive area. Therefore, a problem of relatively high electrical resistance of a conductorized IGZO area in conventional TFT devices can be solved.

20 Claims, 6 Drawing Sheets

(51) Int. Cl.
*H01L 29/417* (2006.01)
*H01L 29/786* (2006.01)

(52) U.S. Cl.
CPC .... *H01L 27/1288* (2013.01); *H01L 29/41733* (2013.01); *H01L 29/7869* (2013.01); *H01L 29/78633* (2013.01)

(56) References Cited

U.S. PATENT DOCUMENTS

| | | | |
|---|---|---|---|
| 2011/0147757 A1* | 6/2011 | Kim | H01L 27/1255 257/E33.001 |
| 2018/0033883 A1* | 2/2018 | Zhou | H01L 23/5329 |
| 2018/0277685 A1* | 9/2018 | Chen | H01L 29/4908 |
| 2019/0172954 A1 | 6/2019 | Zhou et al. | |
| 2020/0091199 A1 | 3/2020 | Song et al. | |

FOREIGN PATENT DOCUMENTS

| | | |
|---|---|---|
| CN | 103715264 A | 4/2014 |
| CN | 107799570 A | 3/2018 |
| CN | 108198824 A | 6/2018 |
| CN | 109075204 A | 12/2018 |
| CN | 109192739 A | 1/2019 |
| CN | 110729250 A | 1/2020 |
| CN | 111180466 A | 5/2020 |

\* cited by examiner

ARRAY SUBSTRATE, MANUFACTURING METHOD THEREOF, AND DISPLAY PANEL

FIELD

The present disclosure relates to the field of display technologies, and more particularly, relates to an array substrate, a manufacturing method thereof, and a display panel.

BACKGROUND

With development of display technologies, display screen development is following a trend toward large-scale and high-resolution display screens. Typically, an active layer of conventional thin film transistors (TFTs) is amorphous silicon (a-Si). A-Si devices are stable because they have been developed for a long time. However, a-Si has poor mobility, negating the a-Si devices' original benefits in high resolution and high refresh rate configurations. As an oxide semiconductor material, indium gallium zinc oxide (IGZO) has a higher mobility compared with a-Si. By using IGZO as a channel material of TFT devices, the resolution of display panels can be increased. Generally, in oxide semiconductor TFT devices with top-gate structures, an IGZO area that is not covered by a gate layer is conductorized with helium plasma after the gate layer and a gate insulating layer are etched. Therefore, a good ohmic contact between a source/drain layer and a semiconductor layer can be ensured. Then, the source/drain layer is manufactured to form the TFT device. Nevertheless, a long-time thermal annealing process causes an increase in electrical resistance of a conductorized IGZO area, which affects conductorization and results in electrical deterioration or even failure of the TFT devices.

Therefore, a following problem needs to be solved: in conventional TFT devices, electrical resistance of a conductorized IGZO area is relatively high.

SUMMARY

The present disclosure provides an array substrate, a manufacturing method thereof, and a display panel to alleviate a following problem: in conventional TFT devices, electrical resistance of a conductorized IGZO area is relatively high.

To solve the above problem, the present disclosure provides technical solutions below.

An embodiment of the present disclosure provides an array substrate, including an active layer, a metal contact layer, a gate insulating layer, a gate layer, a source/drain layer, and a pixel electrode which are sequentially stacked on the substrate. The active layer is disposed on the substrate and includes a channel area. The metal contact layer is disposed on the active layer and includes a conductive area and an insulating area, wherein the insulating area corresponds to the channel area, and the conductive area is disposed at two sides of the insulating area. The gate insulating layer is disposed on the metal contact layer. The gate layer is disposed on the gate insulating layer and includes a gate, wherein the gate is disposed above the channel area. The source/drain layer is disposed on the conductive area and includes a source and a drain. The pixel electrode is disposed on the source/drain layer and is connected to the source or the drain. Wherein, the source and the drain are individually connected to the conductive area.

In the array substrate provided by an embodiment of the present disclosure, the array substrate further includes a light-shielding layer disposed on the substrate and disposed under the active layer.

In the array substrate provided by an embodiment of the present disclosure, a width of the active layer is less than a width of the light-shielding layer.

In the array substrate provided by an embodiment of the present disclosure, a material of the active layer includes one of gallium zinc oxide, indium zinc tin oxide, or indium gallium zinc tin oxide.

In the array substrate provided by an embodiment of the present disclosure, a material of the light-shielding layer includes one of Al, Cu, Mo, Ti, or alloys thereof.

In the array substrate provided by an embodiment of the present disclosure, a material of the metal contact layer includes Al, Cu, Mo, Ti, or alloys thereof.

In the array substrate provided by an embodiment of the present disclosure, a thickness of the metal contact layer ranges from 50 Å to 200 Å.

In the array substrate provided by an embodiment of the present disclosure, a pattern size of the gate insulating layer and a pattern size of the gate are same.

In the array substrate provided by an embodiment of the present disclosure, the array substrate further includes an interlayer insulating layer disposed between the gate layer and the source/drain layer, and a passivation layer and a planarization layer which are disposed between the source/drain layer and the pixel electrode.

An embodiment of the present disclosure provides a method of manufacturing an array substrate, including following steps: S10: providing a substrate, sequentially manufacturing an active layer and a metal contact layer on the substrate, performing a lithography process on the active layer and the metal contact layer with a photomask, and oxidizing a portion of the metal contact layer to form a conductive area and an insulating area, thereby defining a channel area of the active layer; S20: manufacturing a gate insulating layer on the metal contact layer, manufacturing a gate layer on the gate insulating layer, and performing a lithography process on the gate layer and the gate insulating layer to form a gate; and S30: manufacturing an interlayer insulating layer on the gate layer, manufacturing a source/drain layer on the interlayer insulating layer, and performing a lithography process on the source/drain layer to form a source and a drain which are individually connected to the conductive area.

In the method provided by an embodiment of the present disclosure, the step of manufacturing the active layer and the metal contact layer in the S10 includes following steps: manufacturing a light-shielding layer on the substrate, manufacturing a buffer layer on the light-shielding layer, and manufacturing the active layer on the buffer layer; depositing a layer of a metal thin film on the active layer to form the metal contact layer, coating a photoresist on the metal contact layer, and exposing and developing the photoresist with a halftone photomask to form a photoresist pattern; etching the metal contact layer and the active layer to remove a portion of the metal contact layer and a portion of the active layer which are not shielded by the photoresist pattern; ashing the photoresist pattern to thin two sides of the photoresist pattern and removing a middle portion of the photoresist pattern, thereby creating an exposed portion of the metal contact layer; oxidizing the exposed portion of the metal contact layer not shielded by the thinned photoresist pattern to form the insulating area; and stripping the thinned photoresist pattern.

In the method provided by an embodiment of the present disclosure, a width of the active layer is less than a width of the light-shielding layer.

In the method provided by an embodiment of the present disclosure, a material of the metal contact layer includes one of Al, Cu, Mo, Ti, or alloys thereof.

In the method provided by an embodiment of the present disclosure, a thickness of the metal contact layer ranges from 50 Å to 200 Å.

In the method provided by an embodiment of the present disclosure, the two sides of the photoresist pattern are thicker than the middle portion of the photoresist pattern.

In the method provided by an embodiment of the present disclosure, in the S20, the gate is formed by stripping the photoresist.

The method provided by an embodiment of the present disclosure further includes a following step: S40: sequentially forming a passivation layer and a planarization layer on the source/drain layer and the interlayer insulating layer, and manufacturing a pixel electrode on the planarization layer, wherein the pixel electrode is connected to the source or the drain.

An embodiment of the present disclosure provides a display panel including an array substrate. The array substrate includes an active layer, a metal contact layer, a gate insulating layer, a gate layer, a source/drain layer, and a pixel electrode which are sequentially stacked on the substrate. The active layer is disposed on the substrate and includes a channel area. The metal contact layer is disposed on the active layer and includes a conductive area and an insulating area, wherein the insulating area corresponds to the channel area, and the conductive area is disposed at two sides of the insulating area. The gate insulating layer is disposed on the metal contact layer. The gate layer is disposed on the gate insulating layer and includes a gate, wherein the gate is disposed above the channel area. The source/drain layer is disposed on the conductive area and includes a source and a drain. The pixel electrode is disposed on the source/drain layer and is connected to the source or the drain. Wherein, the source and the drain are individually connected to the conductive area.

In the display panel provided by an embodiment of the present disclosure, the array substrate further includes a light-shielding layer disposed on the substrate and disposed under the active layer.

In the display panel provided by an embodiment of the present disclosure, a width of the active layer is less than a width of the light-shielding layer.

Regarding the beneficial effects, in an array substrate and a display panel provided by the present disclosure, a metal contact layer is manufactured on an active layer, so that conductivity and stability of a conductive area of the metal contact layer can be improved. The conductive area is a bridge to connect a source, a drain, and the active layer in a sequential process. Therefore, a following problem is solved: in conventional TFT devices, electrical resistance of a conductorized IGZO area is relatively high. Furthermore, performance deterioration of TFT devices due to weakness or failure of a conductorized area can be effectively prevented. Meanwhile, the active layer and the metal contact layer are deposited at the same time, thereby better protecting a channel area of the active layer. Moreover, an insulating area of the metal contact layer corresponding to the channel area can be a portion of a gate insulating layer after being formed by oxidization. As a result, the active layer can be better protected, and performance of the TFT devices can be more stable.

DESCRIPTION OF DRAWINGS

The accompanying figures to be used in the description of embodiments of the present disclosure or prior art will be described in brief to more clearly illustrate the technical solutions of the embodiments or the prior art. The accompanying figures described below are only part of the embodiments of the present disclosure, from which those skilled in the art can derive further figures without making any inventive efforts.

DETAILED DESCRIPTION

Figure 1:
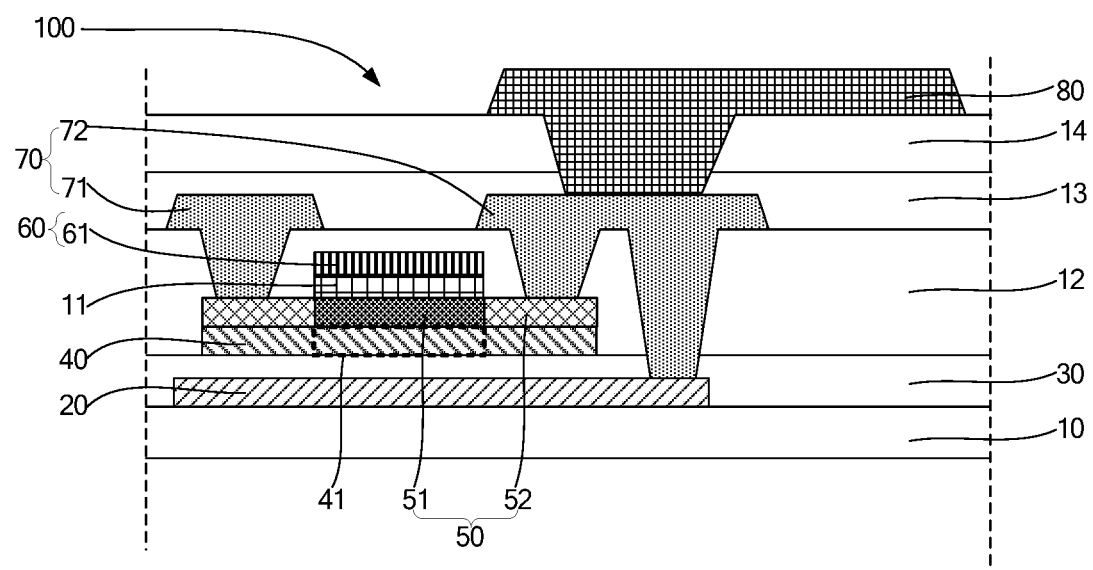
FIG. 1 is a schematic side view showing a layer structure of an array substrate provided by an embodiment of the present disclosure.

The following description of the various embodiments is provided with reference to the accompanying drawings to demonstrate that the embodiments of the present disclosure may be implemented. The following description of the various embodiments is provided with reference to the accompanying drawings. The embodiments described with reference to the attached drawings are all exemplary and are intended to illustrate and interpret the present disclosure. It should be understood that terms such as "top", "bottom", "front", "rear", "left", "right", "inside", "outside", "lateral", as well as derivatives thereof should be construed to refer to the orientation as then described or as shown in the drawings under discussion. These relative terms are for convenience of description, and shall not be construed as causing limitations to the present disclosure. In the drawings, the identical or similar reference numerals constantly denote the identical or similar elements or elements having the identical or similar functions.

An embodiment provides an array substrate 100. As shown in FIG. 1, the array substrate 100 includes a substrate 10, and an active layer 40, a metal contact layer 50, a gate insulating layer 11, a gate layer 60, a source/drain layer 70, and a pixel electrode 80, which are sequentially stacked on the substrate 10. The active layer 40 is disposed on the substrate 10 and includes a channel area 41. The metal contact layer 50 is disposed on the active layer 40 and includes a conductive area 52 and an insulating area 51, wherein the insulating area 51 corresponds to the channel area 41, and the conductive area 52 is disposed at two sides of the insulating area 51. The gate insulating layer 11 is disposed on the metal contact layer 50. The gate layer 60 is disposed on the gate insulating layer 11 and includes a gate 61, wherein the gate 61 is disposed above the channel area 41. The source/drain layer 70 is disposed on the conductive area 52 and includes a source 72 and a drain 71. The pixel electrode 80 is disposed on the source/drain layer 70 and is connected to the source 72 or the drain 71. Wherein, the source 72 and the drain 71 are individually connected to the conductive area 52.

Specifically, the substrate 10 includes a flexible substrate such as a glass substrate or a polyimide substrate.

Specifically, the array substrate 100 further includes a light-shielding layer 20 disposed on the substrate 10 and disposed under the active layer 40. Of course, a buffer layer 30 is further disposed between the active layer 40 and the light-shielding layer 20.

Furthermore, a material of the light-shielding layer 20 includes Al, Cu, Mo, Ti, alloys thereof, or other light-shielding materials.

Furthermore, a width of the active layer 40 is less than a width of the light-shielding layer 20.

Furthermore, a material of the active layer 40 includes a metal oxide semiconductor such as gallium zinc oxide, indium zinc tin oxide, or indium gallium zinc tin oxide.

Furthermore, the metal contact layer 50 and the active layer 40 are etched by lithography with a same mask. Therefore, the metal contact layer 50 and the active layer 40 are formed with the same sized pattern.

Furthermore, a middle portion of the metal contact layer 50 is oxidized after being etched by lithography, thereby forming the conductive area 52 and the insulating area 51 and defining a width-to-length ratio of the channel area 41 of the active layer 40. Two un-oxidized sides of the metal contact layer 50 become the conductive area 52 of the metal contact layer 50, and are configured to connect to the source 72 and the drain 71 of the source/drain layer 70.

Furthermore, a metal oxide insulating area 51 is formed after the middle portion of the metal contact layer 50 is oxidized. The metal oxide insulating area 51 may be a portion of the gate insulating layer 11, thereby better protecting the active layer 40.

Furthermore, the gate insulating layer 11 and the gate layer 60 are etched by lithography with a same mask, thereby forming the gate 61 and a plurality of signal wires (not shown). Wherein, the gate insulating layer 11 and the gate 61 have same pattern size after they are etched.

Furthermore, a material of the metal contact layer 50 includes Al, Cu, Mo, Ti, or alloys thereof.

Furthermore, a thickness of the metal contact layer 50 ranges from 50 Å to 200 Å.

Furthermore, the source 72 or the drain 71 of the source/drain layer 70 is connected to the conductive area 52 of the metal contact layer 50. Compared with a conductorized active layer, the conductive area 52 of the metal contact layer 50 has improved conductivity and improved stability, which effectively prevents performance deterioration of TFT devices due to weakness or failure of a conductorized area.

Furthermore, both a material of the gate layer 60 and a material of the source/drain layer 70 include Al, Cu, Mo, Ti, alloys thereof, or stacked structures thereof.

Furthermore, a plurality of insulating layers are disposed between the gate layer 60, the source/drain layer 70, and the pixel electrode 80. The insulating layers include an interlayer insulating layer 12, a passivation layer 13, and a planarization layer 14. The interlayer insulating layer 12 is disposed between the gate layer 60 and the source/drain layer 70. The passivation layer 13 and the planarization layer 14 are disposed between the source/drain layer 70 and the pixel electrode 80.

Furthermore, a plurality of through-holes are defined on the interlayer insulating layer 12, the passivation layer 13, the planarization layer 14, and the buffer layer 30. The source 72 and drain 71 of the source/drain layer 70 are connected to the conductive area 52 of the metal contact layer 50 by the through-hole of the interlayer insulating layer 12. Furthermore, the source 72 is connected to the light-shielding layer 30 by the through-hole of the interlayer insulating layer 12 and the buffer layer 30. The pixel electrode 80 is connected to the source 72 or the source 71 by the through-hole of the planarization layer 14 and the passivation layer 13. As shown in FIG. 1, the pixel electrode 80 is connected to the source 72.

Figure 2:
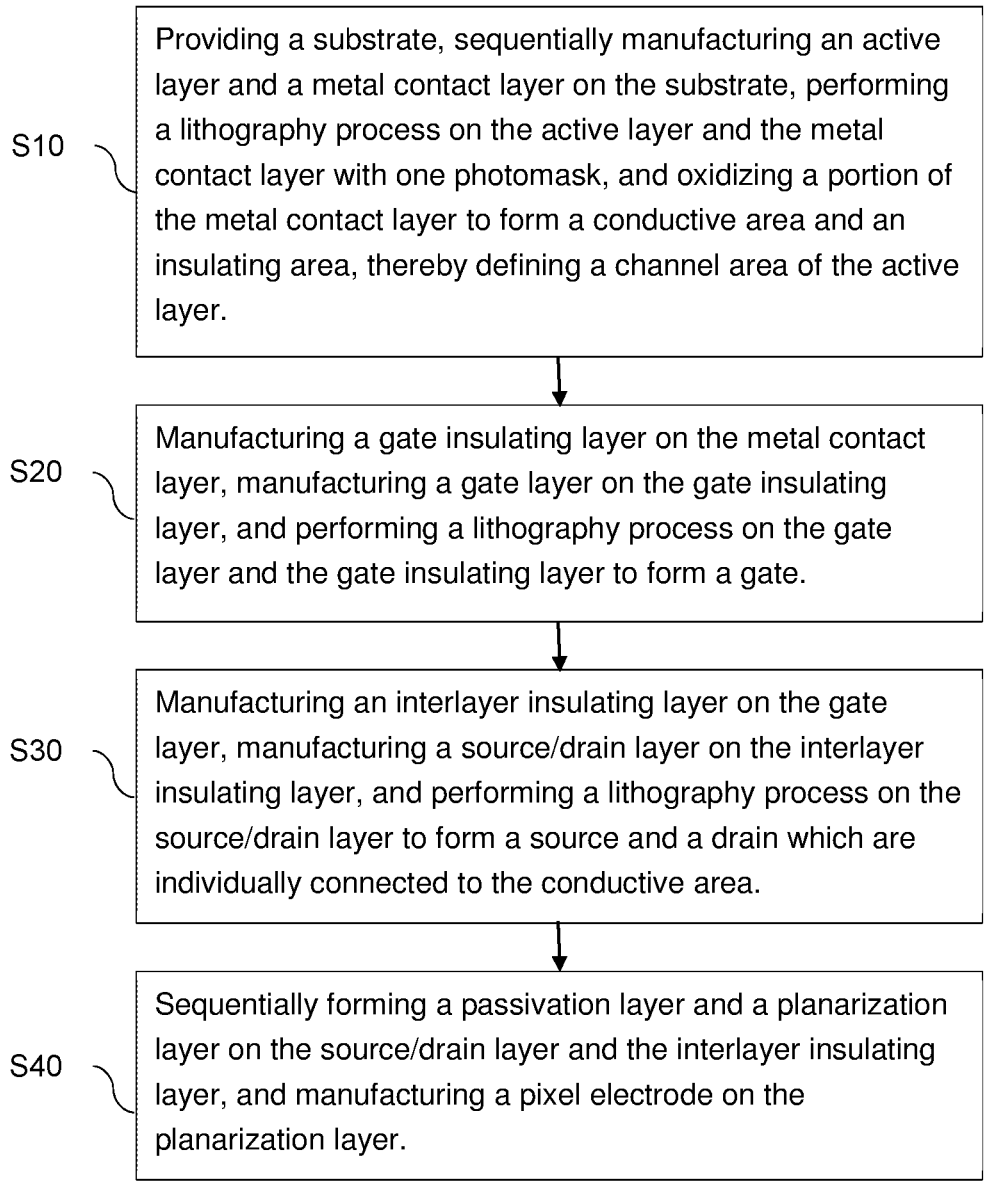
FIG. 2 is a schematic flowchart showing a manufacturing method of an array substrate provided by an embodiment of the present disclosure.

An embodiment provides a method of manufacturing an array substrate, as shown in FIG. 2, including following steps:

S10: providing a substrate, sequentially manufacturing an active layer and a metal contact layer on the substrate, performing a lithography process on the active layer and the metal contact layer with a photomask, and oxidizing a portion of the metal contact layer to form a conductive area and an insulating area, thereby defining a channel area of the active layer.

Figure 3:
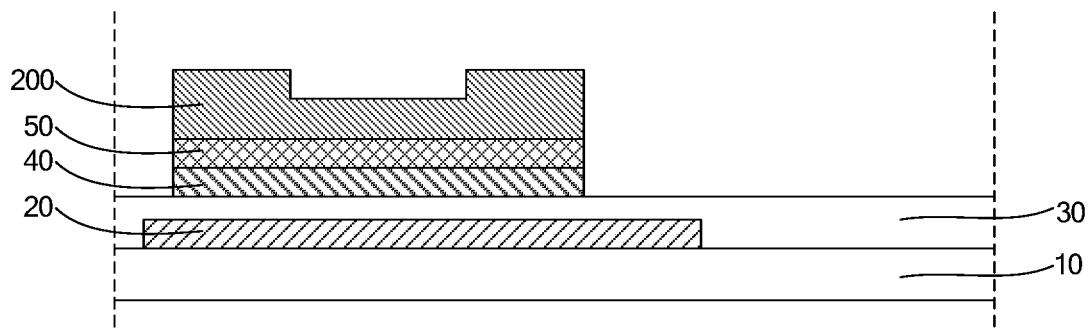
FIG. 3 to FIG. 9 are schematic side views showing layer structures manufactured in each step of the manufacturing method of the array substrate provided by the embodiment of the present disclosure.

Specifically, as shown in FIG. 3, a light-shielding layer 20 is manufactured on a substrate 10, a buffer layer 30 is manufactured on the light-shielding layer 20, and an active layer 40 on the buffer layer 30.

Specifically, a layer of a metal thin film with a thickness ranging from 500 Å to 2000 Å is deposited on the substrate 10. Then, a lithography process is performed on the metal thin film, thereby forming the light-shielding layer 20. The metal thin film used for forming the light-shield layer 20 includes Al, Cu, Mo, Ti, or alloys thereof.

Furthermore, a layer of an inorganic thin film including SiOx or SiNx with a thickness ranging from 1000 Å to 5000 Å is deposited on the light-shielding layer 20 and the substrate 10 to form the buffer layer 30.

Furthermore, a layer of a metal oxide semiconductor thin film with a thickness ranging from 100 Å to 1000 Å is deposited on the buffer layer 30 to form the active layer 40. Then, a layer of a metal thin film with a thickness ranging from 50 Å to 200 Å is deposited on the metal oxide semiconductor thin film to form a metal contact layer 50. The metal thin film of the metal contact layer 50 includes Al, Cu, Mo, Ti, or alloys thereof.

Furthermore, a layer of a photoresist is coated on the metal contact layer 50, and the photoresist is exposed and developed with a halftone photomask to form a photoresist pattern 200. Two sides of the photoresist pattern 200 are thicker than a middle portion of the photoresist pattern 200.

Furthermore, the metal contact layer 50 and the active layer 40 are etched to remove the metal contact layer and the active layer which are not shielded by the photoresist pattern 200.

Figure 4:
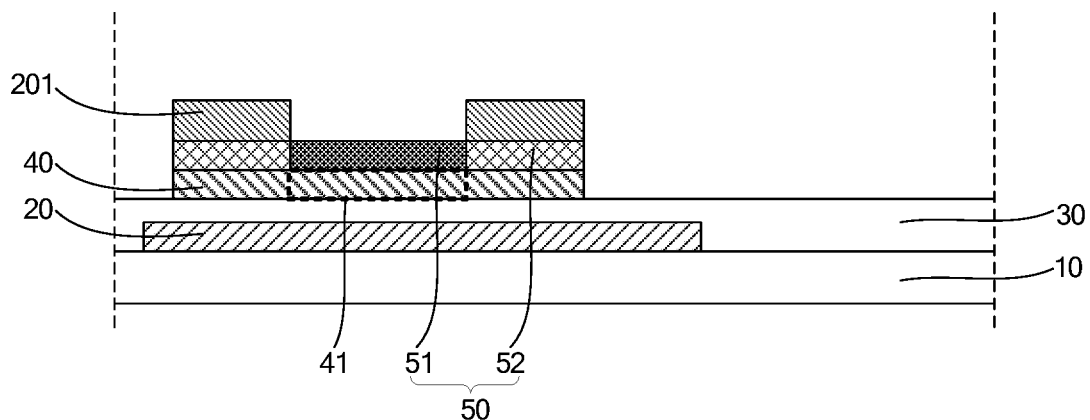

Furthermore, the photoresist pattern 200 is ashed to thin two sides of the photoresist pattern 200 and remove the middle portion of the photoresist pattern 200, thereby exposing a portion of the metal contact layer 50, as shown in FIG. 4.

Furthermore, the exposing metal contact layer 50, which is not shielded by a thinned photoresist pattern 201, is oxidized to form a conductive area 52 and an insulating area 51, thereby defining a channel area 41 of the active layer 40.

Specifically, the metal oxide insulating area 51 is formed after the middle portion of the metal contact layer 50 is oxidized. The insulating area 51 may be a portion of a gate insulating layer in a sequential process, thereby better protecting the active layer 40.

Furthermore, two sides of the metal contact layer 50, which are not oxidized, are the conductive area 52.

Figure 5:
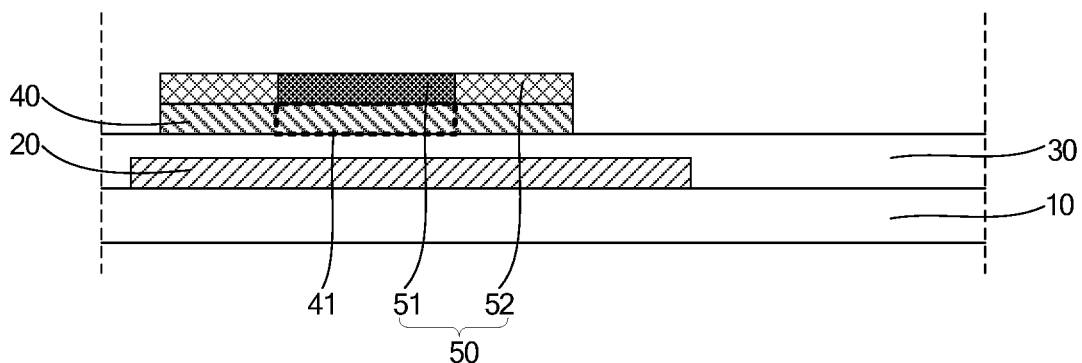

Furthermore, the thinned photoresist pattern 201 is stripped to form a structure as shown in FIG. 5.

Figure 6:
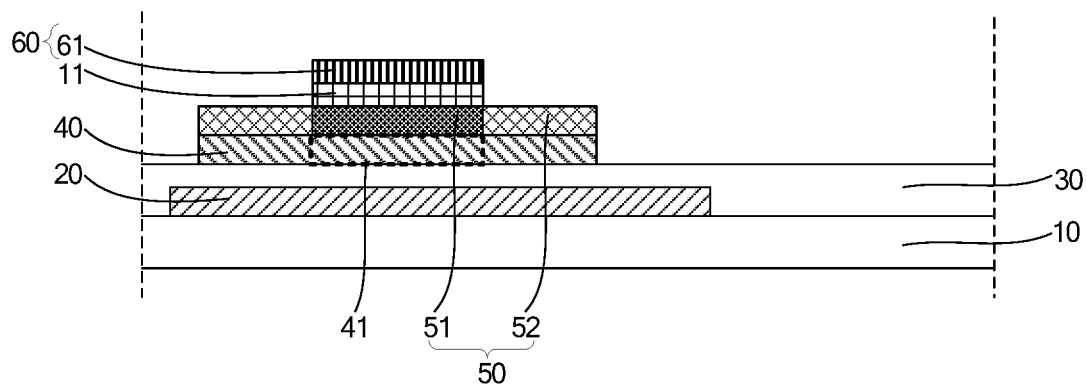

S20: manufacturing a gate insulating layer 11 on the metal contact layer 50, manufacturing a gate layer 60 on the gate insulating layer 11, and performing a lithography process on the gate layer 60 and the gate insulating layer 11 to form a gate 61, as shown in FIG. 6.

Specifically, a layer of an inorganic thin film including SiOx or SiNx with a thickness ranging from 1000 Å to 3000 Å is deposited on the metal contact layer and the buffer layer to form the gate insulating layer.

Furthermore, a layer of a metal thin film with a thickness ranging from 2000 Å to 8000 Å is deposited on the gate insulating layer to form the gate layer. The metal thin film of the gate layer includes Al, Cu, Mo, Ti, alloys thereof, or stacked structures thereof.

Furthermore, the gate layer 60 is etched by lithography to form the gate 61.

Furthermore, a metal pattern of the gate pattern 61 is self-aligned. The gate insulating layer 11 is etched to etch the gate insulating layer 11 which is not shielded by the metal pattern of the gate 61.

Of course, when forming the gate 61 and the gate insulating layer 11, a lift-off process can be used to strip the photoresist, thereby reducing etching times.

S30: manufacturing an interlayer insulating layer on the gate layer, manufacturing a source/drain layer on the interlayer insulating layer, and performing a lithography process on the source/drain layer to form a source and a drain which are individually connected to the conductive area.

Figure 7:
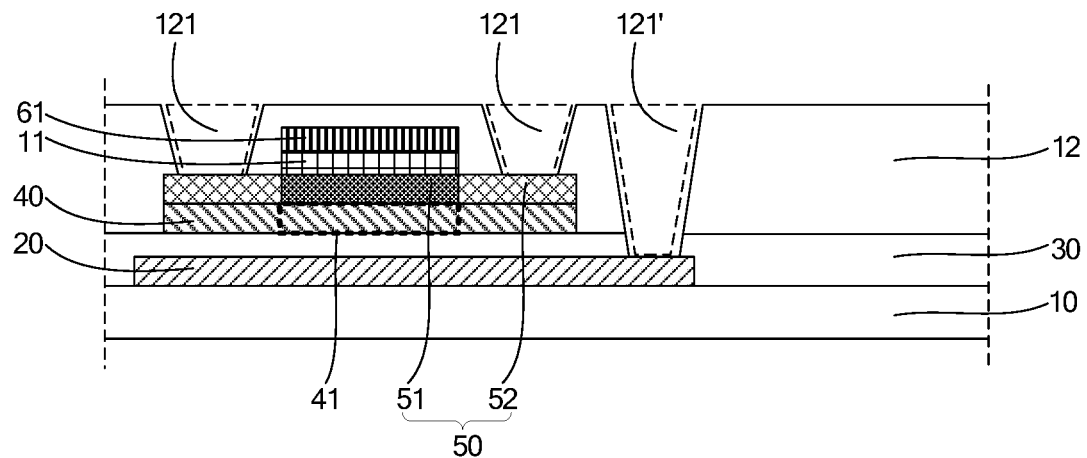

Specifically, as shown in FIG. 7, a layer of an inorganic thin film including SiOx or SiNx with a thickness ranging from 2000 Å to 10000 Å is deposited on the gate layer 60 and the buffer layer 30 to form the interlayer insulating layer 12.

Furthermore, a lithography process is performed on the interlayer insulating layer 12 to form a plurality of through-holes. A through-hole 121 penetrates the interlayer insulating layer 12 and reaches the metal contact layer 50, thereby exposing the conductive area 52 of the metal contact layer 50. A through-hole 121' penetrates the interlayer insulating layer 12 and the buffer layer 30 and reaches the light-shielding layer 20, thereby exposing a portion of the light-shielding layer 20.

Furthermore, a layer of a metal thin film with a thickness ranging from 2000 Å to 8000 Å is deposited on the interlayer insulating layer 12 to form a source/drain layer 70. The thin film of the source/drain layer 70 includes Al, Cu, Mo, Ti, alloys thereof, or stacked structures thereof.

Furthermore, a lithography process is performed on the source/drain layer 70 to form a drain 72, a source 71, and a plurality of signal wires (not shown). The drain 72 and the source 71 are respectively connected to the conductive area 52 of the metal contact layer 50 and the light-shielding layer 20 by the through-holes corresponding to the interlayer insulating layer 12.

Figure 8:
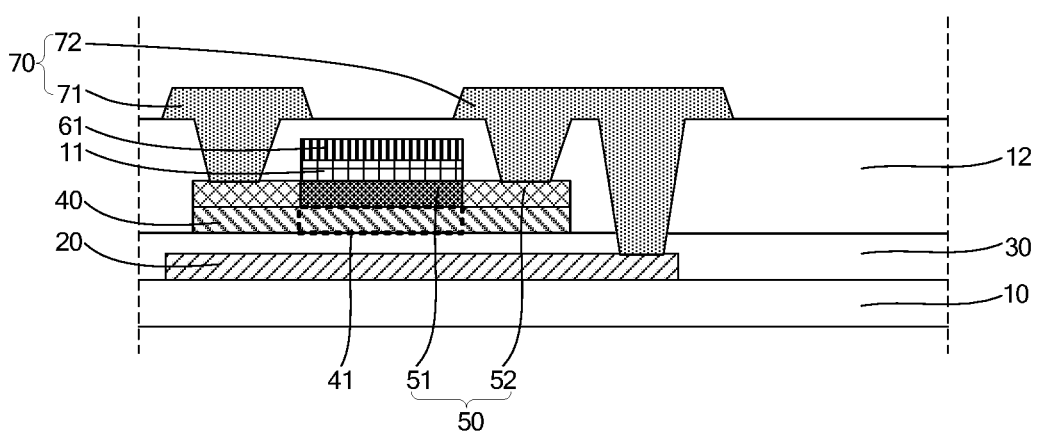

Specifically, as shown in FIG. 8, the source 72 is simultaneously connected to the conductive area 52 and the light-shielding layer 20. The drain 71 is connected to the conductive area 52.

S40: sequentially forming a passivation layer and a planarization layer on the source/drain layer and the interlayer insulating layer, and manufacturing a pixel electrode on the planarization layer.

Figure 9:
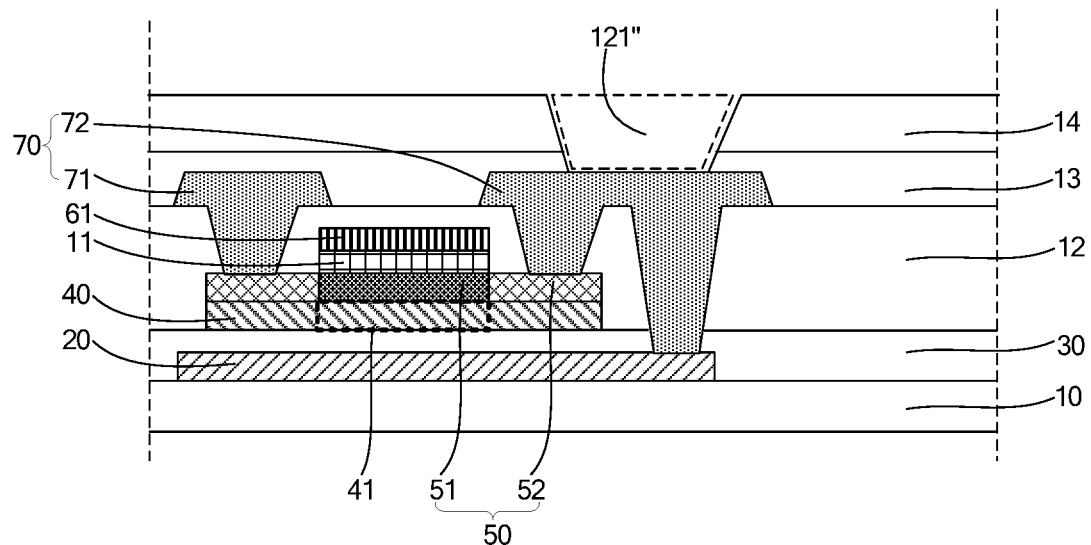

Specifically, as shown in FIG. 9, a layer of an inorganic thin film including SiOx, SiNx, OR SiNOx with a thickness ranging from 1000 Å to 5000 Å is deposited on the source/drain layer 70 and the interlayer insulating layer 12 to form a passivation layer 13.

Furthermore, a planarization layer 14 is deposited on the passivation layer 13. The planarization layer 14 is etched by lithography to form a through-hole 121". The through-hole 121" penetrates the planarization layer 14 and the passivation layer 13, thereby exposing the source 72 and the drain 71. FIG. 9 shows the exposed source 72.

Furthermore, a pixel electrode 80 is manufactured on the planarization layer 14. The pixel electrode 80 is connected to the source 72 and the drain 71 by the through-hole to form an array substrate 100 as shown in FIG. 1. In FIG. 2, the pixel electrode 80 is connected to the source 72.

An embodiment provides a display panel, including one of the above array substrates.

Figure 10:
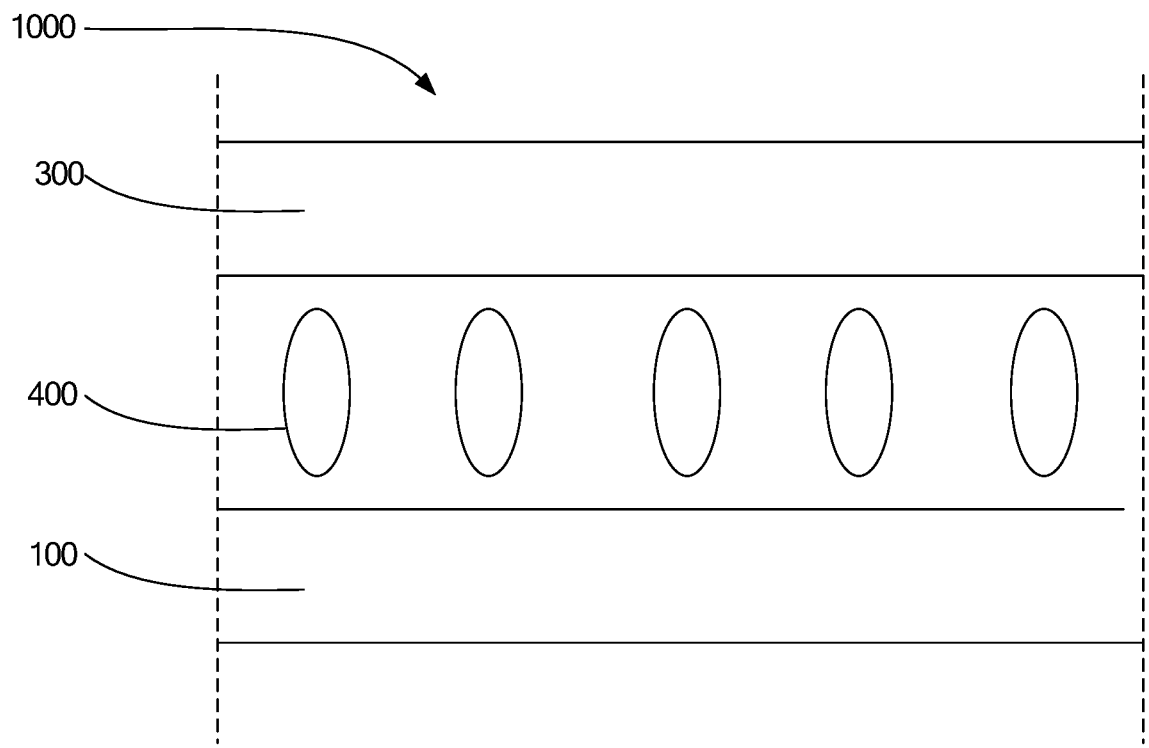
FIG. 10 is a schematic side view showing a first display panel provided by an embodiment of the present disclosure.

Specifically, the display panel is a liquid crystal display (LCD) panel. As shown in FIG. 10, an LCD panel 1000 includes an array substrate 100, a color filter substrate 100 disposed opposite to the array substrate, and a plurality of liquid crystal molecules disposed between the array substrate 100 and the color filter substrate 300.

Figure 11:
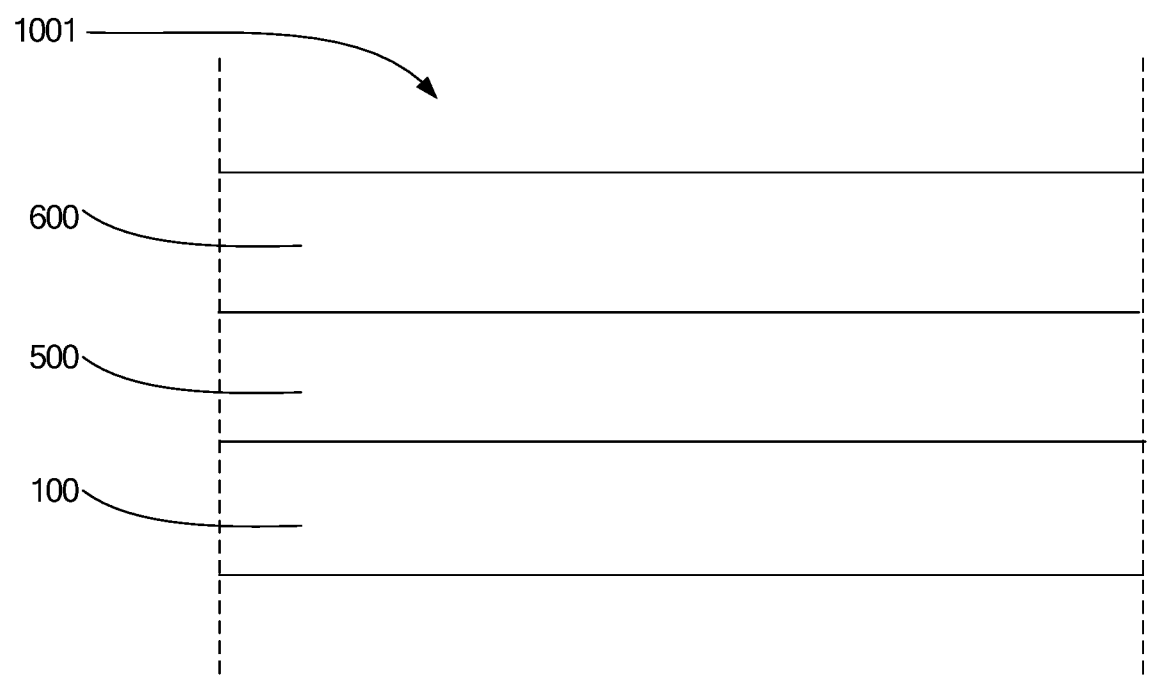
FIG. 11 is a schematic side view showing a second display panel provided by an embodiment of the present disclosure.

Specifically, the display panel is an organic light-emitting diode (OLED) display panel. As shown in FIG. 11, an OLED display panel 1001 includes an array substrate 100, a luminescent functional layer 500 disposed on the array substrate 100, and an encapsulation layer 600 disposed on the luminescent functional layer 500.

According to the above embodiments, the present disclosure provides an array substrate, a manufacturing method thereof, and a display panel. The array substrate includes an active layer, a metal contact layer, a gate insulating layer, a gate layer, a source/drain layer, and a pixel electrode which are sequentially disposed on a substrate. An insulating area of the metal contact layer corresponds to a channel area of the active layer, and a conductive area of the metal contact layer is disposed at two sides of the insulating area. A source and a drain of the source/drain layer are individually connected to the conductive area. The metal contact layer is manufactured on the active layer, so that conductivity and stability of the conductive area of the metal contact layer can be improved. The conductive area can be a bridge to connect the source, the drain, and the active layer in a sequential process. Therefore, a following problem can be solved: in conventional TFT devices, electrical resistance of a conductorized IGZO area is relatively high. Furthermore, performance deterioration of TFT devices due to weakness or failure of a conductorized area can be effectively prevented. Meanwhile, the active layer and the metal contact layer are deposited at the same time, thereby better protecting a channel area of the active layer. Moreover, an insulating area of the metal contact layer corresponding to the channel area can be a portion of a gate insulating layer after being formed by oxidization. As a result, the active layer can be better protected, and performance of the TFT devices can be more stable.

To sum up, the present disclosure has been described with preferred embodiments thereof. The preferred embodiments are not intended to limit the present disclosure, and it is understood that many changes and modifications to the described embodiments can be carried out without departing from the scope and the spirit of the disclosure that is intended to be limited only by the appended claims.

What is claimed is:
1. An array substrate, comprising:
a substrate;
an active layer disposed on the substrate and comprising a channel area;
a metal contact layer disposed on the active layer and comprising a conductive area and an insulating area, wherein the insulating area corresponds to the channel area, and the conductive area is disposed at two sides of the insulating area;

a gate insulating layer disposed on the metal contact layer;

a gate layer disposed on the gate insulating layer and comprising a gate, wherein the gate is disposed above the channel area;

a source/drain layer disposed on the conductive area and comprising a source and a drain; and a pixel electrode disposed on the source/drain layer and connected to the source or the drain;

wherein the source and the drain are individually connected to the conductive area.

2. The array substrate of claim 1, wherein the array substrate further comprises a light-shielding layer disposed on the substrate and disposed under the active layer.

3. The array substrate of claim 2, wherein a width of the active layer is less than a width of the light-shielding layer.

4. The array substrate of claim 3, wherein a material of the active layer comprises one of gallium zinc oxide, indium zinc tin oxide, or indium gallium zinc tin oxide.

5. The array substrate of claim 3, wherein a material of the light-shielding layer comprises one of Al, Cu, Mo, Ti, or alloys thereof.

6. The array substrate of claim 1, wherein a material of the metal contact layer comprises one of Al, Cu, Mo, Ti, or alloys thereof.

7. The array substrate of claim 6, wherein a thickness of the metal contact layer ranges from 50 Å to 200 Å.

8. The array substrate of claim 1, wherein a pattern size of the gate insulating layer and a pattern size of the gate are same.

9. The array substrate of claim 1, wherein the array substrate further comprises an interlayer insulating layer disposed between the gate layer and the source/drain layer, and a passivation layer and a planarization layer which are disposed between the source/drain layer and the pixel electrode.

10. A method of manufacturing an array substrate, comprising following steps:

S10: providing a substrate, sequentially manufacturing an active layer and a metal contact layer on the substrate, performing a lithography process on the active layer and the metal contact layer with a photomask, and oxidizing a portion of the metal contact layer to form a conductive area and an insulating area, thereby defining a channel area of the active layer;

S20: manufacturing a gate insulating layer on the metal contact layer, manufacturing a gate layer on the gate insulating layer, and performing a lithography process on the gate layer and the gate insulating layer to form a gate; and S30: manufacturing an interlayer insulating layer on the gate layer, manufacturing a source/drain layer on the interlayer insulating layer, and performing a lithography process on the source/drain layer to form a source and a drain which are individually connected to the conductive area.

11. The method of claim 10, wherein the step of manufacturing the active layer and the metal contact layer in the S10 comprises following steps:

manufacturing a light-shielding layer on the substrate, manufacturing a buffer layer on the light-shielding layer, and manufacturing the active layer on the buffer layer;

depositing a layer of a metal thin film on the active layer to form the metal contact layer, coating a photoresist on the metal contact layer, and exposing and developing the photoresist with a halftone photomask to form a photoresist pattern;

etching the metal contact layer and the active layer to remove a portion of the metal contact layer and a portion of the active layer which are not shielded by the photoresist pattern;

ashing the photoresist pattern to thin two sides of the photoresist pattern and removing a middle portion of the photoresist pattern, thereby creating an exposed portion of the metal contact layer;

oxidizing the exposed portion of the metal contact layer not shielded by the thinned photoresist pattern to form the insulating area; and stripping the thinned photoresist pattern.

12. The method of claim 11, wherein a width of the active layer is less than a width of the light-shielding layer.

13. The method of claim 11, wherein a material of the metal contact layer comprises one of Al, Cu, Mo, Ti, or alloys thereof.

14. The method of claim 13, wherein a thickness of the metal contact layer ranges from 50 Å to 200 Å.

15. The method of claim 11, wherein the two sides of the photoresist pattern are thicker than the middle portion of the photoresist pattern.

16. The method of claim 10, wherein in the S20, the gate is formed by stripping the photoresist.

17. The method of claim 10, further comprising following steps:

S40: sequentially forming a passivation layer and a planarization layer on the source/drain layer and the interlayer insulating layer, and manufacturing a pixel electrode on the planarization layer, wherein the pixel electrode is connected to the source or the drain.

18. A display panel, comprising an array substrate;

wherein the array substrate comprises:

a substrate;

an active layer disposed on the substrate and comprising a channel area;

a metal contact layer disposed on the active layer and comprising a conductive area and an insulating area, wherein the insulating area corresponds to the channel area, and the conductive area is disposed at two sides of the insulating area;

a gate insulating layer disposed on the metal contact layer;

a gate layer disposed on the gate insulating layer and comprising a gate, wherein the gate is disposed above the channel area;

a source/drain layer disposed on the conductive area and comprising a source and a drain; and a pixel electrode disposed on the source/drain layer and connected to the source or the drain; and wherein the source and the drain are individually connected to the conductive area.

19. The display panel of claim 18, wherein the array substrate further comprises a light-shielding layer disposed on the substrate and disposed under the active layer.

20. The display panel of claim 19, wherein a width of the active layer is less than a width of the light-shielding layer.

* * * * *